United States Patent
Huang et al.

(10) Patent No.: US 7,372,273 B2
(45) Date of Patent: May 13, 2008

(54) HIGH TEMPERATURE SUPERCONDUCTING CURRENT LEADS FOR SUPERCONDUCTING MAGNETS

(75) Inventors: Xianrui Huang, Clifton Park, NY (US); Paul S. Thompson, Stephentown, NY (US); Xu Minfeng, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 40 days.

(21) Appl. No.: 11/537,676

(22) Filed: Oct. 2, 2006

(65) Prior Publication Data

US 2008/0079428 A1    Apr. 3, 2008

(51) Int. Cl.
*G01V 3/00* (2006.01)

(52) U.S. Cl. ...................... 324/318; 324/322

(58) Field of Classification Search ........ 324/300–322; 505/231, 220; 335/299; 351/141
See application file for complete search history.

(56) References Cited

U.S. PATENT DOCUMENTS

| | | | | |
|---|---|---|---|---|
| 4,895,831 A | * | 1/1990 | Laskaris | 505/163 |
| 5,376,755 A | * | 12/1994 | Negm et al. | 505/231 |
| 5,724,820 A | * | 3/1998 | Iwasa | 62/51.1 |
| 5,991,647 A | * | 11/1999 | Brockenborough et al. | 505/163 |
| 6,289,681 B1 | * | 9/2001 | Eckels et al. | 62/47.1 |
| 6,838,964 B1 | * | 1/2005 | Knight et al. | 335/216 |
| 7,064,550 B2 | * | 6/2006 | Shen | 324/319 |

* cited by examiner

*Primary Examiner*—Brij B. Shrivastav
(74) *Attorney, Agent, or Firm*—Jason K. Klindtworth; Curtis B. Brueske

(57) ABSTRACT

An electrical current lead assembly for ramping a superconducting magnet includes a vacuum vessel wall that has a first side exposed to an atmospheric pressure and a second side exposed to a vacuum pressure. A pool wall extends from the first side of the vacuum vessel wall and forms a dam region. A first conductor is affixed to and sealingly penetrates the vacuum vessel wall and has a first portion extending into the dam region. A second conductor is affixed to and sealingly penetrates the vacuum vessel wall and has a first portion extending into the dam region. A superconducting magnet on the second side of the vacuum vessel wall has a first low temperature superconducting (LTS) lead and a second LTS lead. A first superconductor electrically connects the first conductor to the first LTS lead, and a second superconductor electrically connecting the second conductor to the second LTS lead.

25 Claims, 3 Drawing Sheets

HIGH TEMPERATURE SUPERCONDUCTING CURRENT LEADS FOR SUPERCONDUCTING MAGNETS

BACKGROUND OF THE INVENTION

The present invention relates generally to superconducting magnet systems and, more particularly, to minimizing heat load to a superconducting magnet system during magnet ramping. The present invention also relates to reducing the thermal load on a magnet during persistent operation of the magnet.

When a substance such as human tissue is subjected to a uniform magnetic field (polarizing field $B_0$), the individual magnetic moments of the spins in the tissue attempt to align with this polarizing field, but process about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

MR systems typically use superconducting magnets, often with multiple coils to generate the uniform magnetic field. These superconducting magnets are part of a cold mass cooled by liquid helium. The magnets are made typically of niobium-titanium material that is cooled to a temperature of 4.2 K with liquid helium. Exemplary superconducting magnet systems operating in MRI systems require occasional ramping of the superconducting magnet to charge the magnet for use of the MRI system. After the superconducting magnet is ramped, the current supply used for the magnet ramping is disconnected and is not needed until further magnet ramping is necessary, such as for demagnetization of the superconducting magnet or for remagnetization of the superconducting magnet after, for instance, scheduled service, a magnet quench, and the like.

Frequently, retractable current leads are used that are only connected to the superconducting magnet during magnet ramps. After the superconducting magnet is ramped, and during normal operation, the current leads are retracted to remove the conduction heat load from the leads to the superconducting magnet. Such retractable leads are normally maintained at room temperature and, together with the equipment used to power the leads, when connected to the superconducting magnet, serve as a heat load on the superconducting magnet.

It would therefore be desirable to have a system and method capable of ramping a superconducting magnet while minimizing the heat load on the superconducting magnet.

BRIEF DESCRIPTION OF THE INVENTION

The present invention provides a system and method of ramping a superconducting magnet assembly that overcomes the aforementioned drawbacks. A pair of leads extend from a vacuum vessel of a superconducting magnet system and are electrically connected to a superconducting magnet for ramping the superconducting magnet to and from operating conditions.

In accordance with one aspect of the invention, an electrical current lead assembly for ramping for ramping a superconducting magnet, the assembly comprises a vacuum vessel wall that has a first side exposed to an atmospheric pressure and a second side exposed to a vacuum pressure. A pool wall extends from the first side of the vacuum vessel wall and forms a dam region. A first conductor is affixed to and sealingly penetrates the vacuum vessel wall and has a first portion extending into the dam region. A second conductor is affixed to and sealingly penetrates the vacuum vessel wall and has a first portion extending into the dam region. A superconducting magnet on the second side of the vacuum vessel wall has a first low temperature superconducting (LTS) lead and a second LTS lead. A first superconductor electrically connects the first conductor to the first LTS lead, and a second superconductor electrically connecting the second conductor to the second LTS lead.

The present invention is also directed to a method of fabricating a lead assembly for a superconducting magnet. The method comprises the step of providing a vacuum vessel comprising a housing having an interior surface and an exterior surface, the interior surface enclosing an interior volume. The method further comprises the steps of attaching a dam wall to the exterior surface encircling a coolant pool region, providing a superconducting magnet within the interior volume, the superconducting magnet having a pair of LTS leads, electrically connecting a first end of each of a pair of superconducting leads within the interior volume to the LTS leads of the superconducting magnet, and electrically connecting a second end of each of the pair of superconducting leads through the housing and penetrating into the coolant pool region.

The present invention is also directed to an MRI apparatus including a vacuum vessel that surrounds a vacuum space and comprises an enclosure having an atmospheric pressure side and a vacuum side, and a pool wall sealingly attached to the atmospheric pressure side of the enclosure and forming a cryogenic pool zone. A superconducting magnet is enclosed within the vacuum space having a first LTS lead and a second LTS lead. A plurality of gradient coils is positioned about a bore of the superconducting magnet to impress a polarizing magnetic field, and an RF transceiver system and an RF switch are controlled by a pulse module to transmit RF signals to an RF coil assembly to acquire MR images. A magnet ramp system includes a first conductor penetrating the enclosure and extending into the cryogenic pool zone, a second conductor penetrating the enclosure and extending into the cryogenic pool zone, a first superconducting lead electrically connected to the first LTS lead and the first conductor, and a second superconducting lead electrically connected to the second LTS lead and the second conductor.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
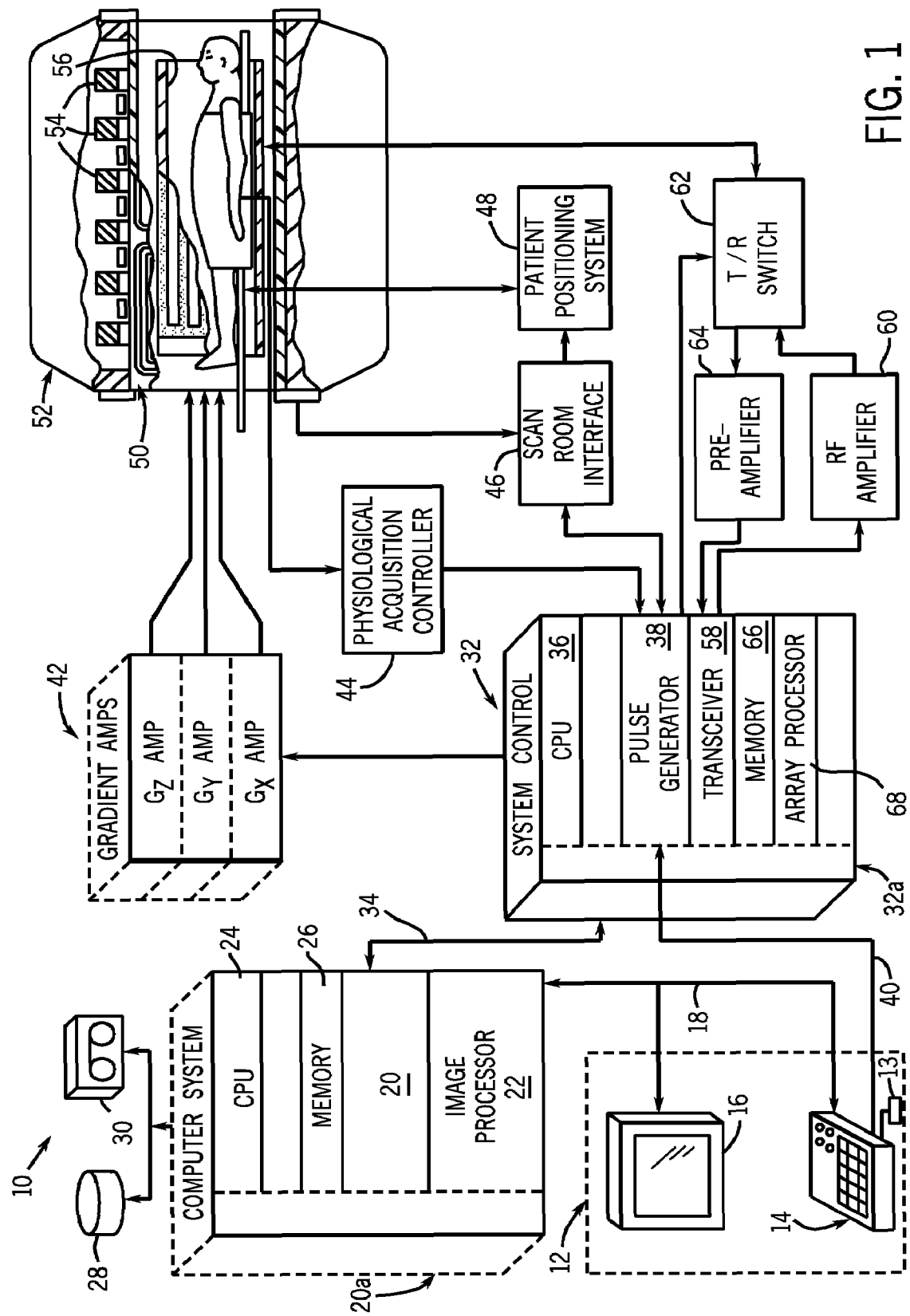
FIG. 1 is a schematic block diagram of an MR imaging system that can benefit from incorporation of the present invention.

Referring to FIG. 1, superconducting magnet system 10 in an example comprises a superconducting magnet system operating in an alternating current (AC) environment. Exemplary superconducting magnet systems comprise a transformer, a generator, a motor, superconducting magnet energy storage (SMES), and/or a magnetic resonance (MR) system. Although a conventional MR magnet operates in a DC mode, some MR magnets may operate under an AC magnetic field from the gradient coils when the gradient leakage field to the magnet is high. Such an AC magnetic field generates AC losses in the magnet. An illustrative discussion of exemplary details of a magnetic resonance and/or magnetic resonance imaging (MRI) apparatus and/or system are presented, for explanatory purposes.

The operation of the MR system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and removable storage 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the removable storage 30, or it may be further processed by the image processor 22 and conveyed to the operator console 12 and presented on the display 16.

Figure 2:
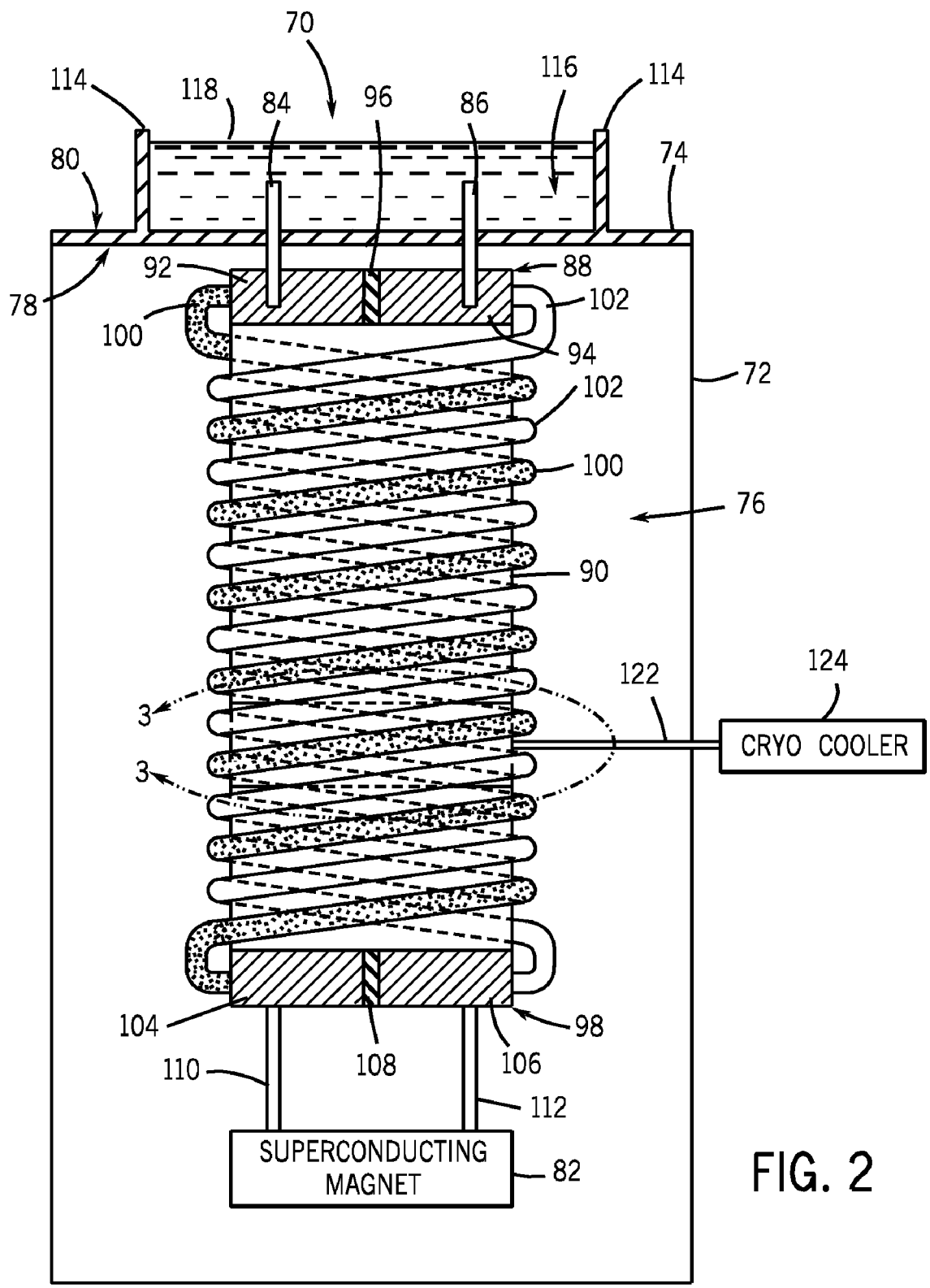
FIG. 2 is a schematic diagram of a magnet ramp assembly in accordance with an embodiment of the present invention.

FIG. 2 shows a schematic diagram of a magnet ramp assembly 70 in accordance with an embodiment of the present invention. A vacuum vessel 72 includes a wall 74 enclosing an interior volume 76 having a vacuum side 78 of the vacuum vessel 72 and an exterior, or atmospheric pressure side 80 exposed to atmosphere. A superconducting magnet 82, such as the magnet assembly 52 of FIG. 1, is contained within the interior volume 76 of vacuum vessel 72. Magnet ramp assembly 70 electrically connects the superconducting magnet 82 to a current source or a dummy load (not shown) for ramping the superconducting magnet 82 to and from operating conditions.

Magnet ramp assembly 70 includes a pair of leads 84, 86 that penetrate the wall 74 and extend therefrom on each side 78, 80. Leads 84, 86 are made of an electrically and thermally conductive material such as copper. Leads 84, 86 sealingly engage the wall 74 to minimize pressure flow therearound from atmosphere to the interior volume 76 of vacuum vessel 72. Leads 84, 86 are further electrically isolated from the wall 74 such that electrical current does not flow from one lead 84 to the other lead 86 through the wall 74.

In the interior volume 76 of vacuum vessel 72, leads 84, 86 attach to a top end plate 88 connected to a cylinder 90. Cylinder 90 is preferably electrically insulative. Top end plate 88 is divided into a first section 92 and a second section 94 that are electrically isolated one from the other by an electrically insulative divider 96. Lead 84 is electrically connected to first section 92 of top end plate 88, and lead 86 is electrically connected to second section 94 of top end plate 88. Top end plate 88 is electrically connected to a bottom end plate 98 of cylinder 90 via a pair of superconductors 100, 102. Bottom end plate 98 is divided into a first section 104 and second section 106 that are electrically isolated one from the other by an electrically insulative divider 108. The pair of superconductors 100, 102 are preferably made of high temperature superconducting materials such as BSCCO tape, YBCO tape, and the like. Top and bottom end plates 88, 98 are preferably made of copper.

Superconductors 100, 102 electrically connect top plate sections 92, 94 to bottom plate sections 104, 106, respectively. In a preferred embodiment, superconductors 100, 102 are wound around cylinder 90, and electrically isolated therefrom using a plastic such as, for instance, kapton. Superconductors 100, 102 are wound in a spiral, or helical, pattern to elongate the thermal conduction path therein between end plates 88, 98. Additionally, superconductors 100, 102 are preferably wound in a bifilar winding. In this manner, magnetic fields and forces induced by currents generated in superconductors 100, 102 tend to cancel. Cylinder 90 is preferably made of an electrically and thermally insulating material such as plastic, fiber composites, and the like.

The first and second sections 104, 106 of bottom end plate 98 are electrically connected to the superconducting magnet 82 via a pair of low temperature superconducting (LTS) leads 110, 112 of the superconducting magnet 82. An electrical circuit is thus formed from lead 84 to lead 86. That is, lead 84 is electrically connected to the superconducting magnet 82 via first section 92 of top end plate 88, first superconductor 100, first section 104 of bottom end plate 98, and LTS lead 110. Lead 86 is electrically connected to the superconducting magnet 82 via second section 94 of top end plate 88, second superconductor 102, second section 106 of bottom end plate 98, and LTS lead 112.

Still referring to FIG. 2, a dam 114, or pool wall, is sealingly attached to the atmospheric pressure side 80 of wall 74 and encircles the leads 84, 86 to form a pool zone, or dam region 116. For ramping up superconducting magnet 82, an operator or technician connects a current supply (not shown) to leads 84, 86 and fills pool zone, or dam region 116 with a cryogen 118 such as liquid nitrogen. In this manner, leads 84, 86 are immersed in the cryogen 118 and their temperature begins to decrease. Cryogen 118, having a boiling temperature below that of the critical temperature of first and second superconductors 100, 102, reduces the temperature of leads 84, 86. Leads 84, 86 conductively cool top end plate 88 which, in turn, conductively cools first and second superconductors 100, 102 below their critical temperatures. The LTS leads 110, 112 of the superconducting magnet 82 assist to cool first and second superconductors 100, 102 below their critical temperatures.

Following the changing of the first and second superconductors 100, 102 to a superconducting state by having leads 84, 86 below the critical temperature, the superconducting magnet 82 is ramped up by application of current to leads 84, 86. With the first and second superconductors 100, 102 in a superconducting state, electrically resistive heating in the leads 84, 86, the top and bottom end plates, 88, 98, the first and second superconductors 100, 102 and the superconducting magnet 82 is reduced during the ramp. After the ramp of the magnet is complete, cryogen 118 is left to boil out of the pool zone, or dam region 116, the operator removes the current supply from leads 84, 86, and the superconducting magnet 82 operates in a normal operating mode.

For ramping down superconducting magnet 82, the operator or technician connects a current supply or dummy load (not shown) to leads 84, 86 and fills pool zone, or dam region 116 with the cryogen 118. Following the changing of the first and second superconductors 100, 102 to a superconducting state as described above, the current supply or dummy load acts to reduce current in the superconducting magnet 82 to zero. Again, cryogen 118 is left to boil out of the pool zone, or dam region 116, and the superconducting magnet 82 may be serviced if needed.

Figure 3:
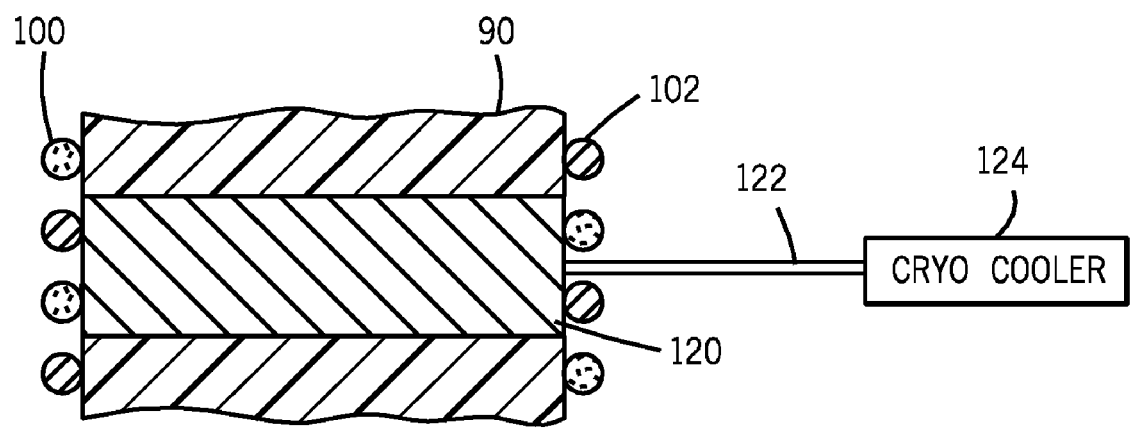
FIG. 3 is a cross sectional view of the magnet ramp assembly of FIG. 2 taken along line 3-3.

Referring now to FIGS. 2 and 3, cylinder 90 includes a heat sink, or intercept 120 positioned between top end plate 88 and bottom end plate 98 for intercepting heat conducted from leads 84, 86 through first and second superconductors 100, 102 to superconducting magnet 82 when the temperature of the leads 84, 86 is above their critical temperatures, such as room temperature. A thermal link 122 thermally connects heat sink, or intercept 120 to a cryocooler 124. In a preferred embodiment, cryocooler 124 is a dedicated unit for cooling the heat sink, or intercept 120 below the critical temperatures of the first and second superconductors 100, 102 such as, for example, 40K. However, it is contemplated that different stages of cryocooler 124 may be connected to both the superconducting magnet 82 and the heat sink, or intercept 120. Heat sink, or intercept 120 and thermal link 122 are preferably made of a material having a high thermal conductivity such as copper.

A magnet ramping assembly according to an embodiment of the present invention minimizes heat load to a superconducting magnet system during magnet ramping and during normal operation of the superconducting magnet when the current leads external to the vacuum vessel are exposed to ambient temperatures.

Therefore, the present invention includes an electrical current lead assembly for ramping a superconducting magnet, the assembly comprises a vacuum vessel wall that has a first side exposed to an atmospheric pressure and a second side exposed to a vacuum pressure. A pool wall extends from the first side of the vacuum vessel wall and forms a dam region. A first conductor is affixed to and sealingly penetrates the vacuum vessel wall and has a first portion extending into the dam region. A second conductor is affixed to and sealingly penetrates the vacuum vessel wall and has a first portion extending into the dam region. A superconducting magnet on the second side of the vacuum vessel wall has a first low temperature superconducting (LTS) lead and a second LTS lead. A first superconductor electrically connects the first conductor to the first LTS lead, and a second superconductor electrically connecting the second conductor to the second LTS lead.

The present invention is also direct to a method of fabricating a lead assembly for a superconducting magnet. The method comprises the step of providing a vacuum vessel comprising a housing having an interior surface and an exterior surface, the interior surface enclosing an interior volume. The method further comprises the steps of attaching a dam wall to the exterior surface encircling a coolant pool region, providing a superconducting magnet within the interior volume, the superconducting magnet having a pair of LTS leads, electrically connecting a first end of each of a pair of superconducting leads within the interior volume to the LTS leads of the superconducting magnet, and electrically connecting a second end of each of the pair of superconducting leads through the housing and penetrating into the coolant pool region.

The present invention is also directed to an MRI apparatus including a vacuum vessel that surrounds a vacuum space and comprises an enclosure having an atmospheric pressure side and a vacuum side, and a pool wall sealingly attached to the atmospheric pressure side of the enclosure and forming a cryogenic pool zone. A superconducting magnet is enclosed within the vacuum space having a first LTS lead and a second LTS lead. A plurality of gradient coils is positioned about a bore of the superconducting magnet to impress a polarizing magnetic field, and an RF transceiver system and an RF switch are controlled by a pulse module to transmit RF signals to an RF coil assembly to acquire MR images. A magnet ramp system includes a first conductor penetrating the enclosure and extending into the cryogenic pool zone, a second conductor penetrating the enclosure and extending into the cryogenic pool zone, a first superconducting lead electrically connected to the first LTS lead and the first conductor, and a second superconducting lead electrically connected to the second LTS lead and the second conductor.

The present invention has been described in terms of the preferred embodiment, and it is recognized that equivalents, alternatives, and modifications, aside from those expressly stated, are possible and within the scope of the appending claims.

What is claimed is:

1. An electrical current lead assembly for ramping a superconducting magnet, the assembly comprising:
    a vacuum vessel wall having a first side exposed to an atmospheric pressure and a second side exposed to a vacuum pressure;
    a pool wall extending from the first side of the vacuum vessel wall and forming a dam region;
    a first conductor affixed to and sealingly penetrating the vacuum vessel wall and having a first portion extending into the dam region;
    a second conductor affixed to and sealingly penetrating the vacuum vessel wall and having a first portion extending into the dam region;
    a superconducting magnet on the second side of the vacuum vessel wall having a first low temperature superconducting (LTS) lead and a second LTS lead;
    a first superconductor electrically connecting the first conductor to the first LTS lead; and
    a second superconductor electrically connecting the second conductor to the second LTS lead.

2. The assembly of claim 1 wherein the first and second conductors comprise a thermally conductive material.

3. The assembly of claim 2 wherein the first and second conductors are copper.

4. The assembly of claim 1 wherein the pool wall is configured to contain a cryogen in the dam region, the cryogen having a boiling temperature below a critical temperature of the first and second superconductors.

5. The assembly of claim 4 wherein the cryogen is liquid nitrogen.

6. The assembly of claim 1 wherein the first and second conductors are electrically insulated from the vacuum vessel wall.

7. The assembly of claim 1 further comprising:
    a cylinder positioned adjacent to the second side of the vacuum vessel wall;
    a top plate attached to a first end of the cylinder and having a first section electrically connected to the first conductor and a second section electrically connected to the second conductor, wherein the first section and the second section are electrically isolated one from the other; and
    a bottom plate attached to a second end of the cylinder and having a first section and a second section, wherein the first section and the second section are electrically isolated one from the other;
    wherein the first superconductor is electrically connected to the first section of the top plate and to the first section of the bottom plate; and
    wherein the second superconductor is electrically connected to the second section of the top plate and to the second section of the bottom plate.

8. The assembly of claim 7 wherein the first superconductor and the second superconductor are spirally wrapped in a bifilar winding about the cylinder.

9. The assembly of claim 7 wherein the first superconductor and the second superconductor are high temperature superconductors comprising one of BSCCO tape and YBCO tape.

10. The assembly of claim 7 wherein the cylinder comprises one of a plastic and a fiber composite.

11. The assembly of claim 7 further comprising a heat intercept attached to the cylinder between the first end and the second end, and wherein the heat intercept is thermally connected to a cryocooler.

12. The assembly of claim 11 wherein the heat intercept is copper.

13. The assembly of claim 7 wherein the first superconductor and the second superconductor are electrically isolated from the cylinder.

14. A method of fabricating a lead assembly for a superconducting magnet comprising the steps of:
    providing a vacuum vessel comprising a housing having an interior surface and an exterior surface, the interior surface enclosing an interior volume;
    attaching a dam wall to the exterior surface encircling a coolant pool region;
    providing a superconducting magnet within the interior volume, the superconducting magnet having a pair of LTS leads;
    electrically connecting a first end of each of a pair of superconducting leads within the interior volume to the LTS leads of the superconducting magnet; and
    electrically connecting a second end of each of the pair of superconducting leads to a respective lead extending through the housing and penetrating into the coolant pool region.

15. The method of claim 14 further comprising the step of thermally isolating the second end of the pair of superconducting leads from the superconducting magnet.

16. The method of claim 15 wherein the step of thermally isolating further comprises the steps of:
    electrically connecting the pair of superconductors to the first ends of the pair of LTS leads;
    thermally connecting the pair of superconductors to a heat sink; and
    thermally connecting the heat sink to a cryocooler.

17. The method of claim 16 further comprising the step of spirally wrapping the pair of superconductors in a bifilar orientation about a thermally insulative cylinder.

18. An MRI apparatus comprising:
    a vacuum vessel surrounding a vacuum space and comprising an enclosure having an atmospheric pressure side and a vacuum side;

a pool wall sealingly attached to the atmospheric pressure side of the enclosure and forming a cryogenic pool zone;

a superconducting magnet enclosed within the vacuum space having a first LTS lead and a second LTS lead;

a plurality of gradient coils positioned about a bore of the superconducting magnet to impress a polarizing magnetic field and an RF transceiver system and an RF switch controlled by a pulse module to transmit RF signals to an RF coil assembly to acquire MR images; and a magnet ramp system including:
- a first conductor penetrating the enclosure and extending into the cryogenic pool zone;
- a second conductor penetrating the enclosure and extending into the cryogenic pool zone;
- a first superconducting lead electrically connected to the first LTS lead and the first conductor; and
- a second superconducting lead electrically connected to the second LTS lead and the second conductor.

19. The apparatus of claim 18 wherein the first superconducting lead and the second superconducting lead are high temperature superconductors comprising one of bulk ceramic BSCCO, BSCCO tape, and YBCO tape.

20. The apparatus of claim 18 further comprising:
a cylinder positioned between the superconducting magnet and the enclosure;
a top plate attached to the cylinder, the top plate having a first section electrically isolated from a second section, wherein the first section is electrically connected to the first conductor, and the second section is electrically connected to the second conductor; and
a bottom plate attached to the composite cylinder, the bottom plate having a first section electrically isolated from a second section, the first and second sections electrically connected to the superconducting magnet;
wherein the first superconducting lead is wrapped about the cylinder; and
wherein the second superconducting lead is wrapped about the cylinder.

21. The apparatus of claim 20 further comprising:
a heat intercept attached to the cylinder and positioned between the top plate and the bottom plate, the heat intercept thermally connected to the first and second superconducting leads; and
a cryocooler thermally connected to the heat intercept.

22. The apparatus of claim 21 wherein the heat intercept is copper.

23. The apparatus of claim 20 wherein the first superconductor and the second superconductor are wrapped in a bifilar spiral arrangement about the cylinder.

24. The apparatus of claim 20 further comprising:
a first insulative coating surrounding the first superconductor; and
a second insulative coating surrounding the second superconductor.

25. The apparatus of claim 24 wherein the first and second insulative coatings comprise kapton.

* * * * *